(12) United States Patent
Malinovich et al.

(10) Patent No.: US 6,169,319 B1
(45) Date of Patent: Jan. 2, 2001

(54) BACKSIDE ILLUMINATED IMAGE SENSOR

(75) Inventors: Yacov Malinovich, Tivon; Ephie Koltin, Givat Elah, both of (IL)

(73) Assignee: Tower Semiconductor Ltd., Migdal Haemek (IL)

( * ) Notice: Under 35 U.S.C. 154(b), the term of this patent shall be extended for 0 days.

(21) Appl. No.: 09/441,766

(22) Filed: Nov. 17, 1999

Related U.S. Application Data

(62) Division of application No. 09/372,863, filed on Aug. 12, 1999.

(51) Int. Cl.[7] .................. H01L 27/146; H01L 31/0232
(52) U.S. Cl. ...................... 257/447; 257/292; 257/228
(58) Field of Search .................................. 257/228, 291, 257/292, 447, 460

(56) References Cited

U.S. PATENT DOCUMENTS

| | | |
|---|---|---|
| 4,377,817 | 3/1983 | Nishizawa et al. . |
| 5,134,274 | * 7/1992 | Poole et al. .......................... 257/447 |
| 5,227,313 | 7/1993 | Gluck et al. . |
| 5,455,455 | 10/1995 | Badehi . |
| 5,598,016 | * 1/1997 | Tanabe et al. ........................ 257/228 |
| 5,818,404 | 10/1998 | Lebby et al. . |

* cited by examiner

*Primary Examiner*—Gene M. Munson
(74) *Attorney, Agent, or Firm*—Bever, Hoffman & Harms, LLP; Patrick T. Bever

(57) ABSTRACT

A method for producing a back-illuminated CMOS image sensor including a matrix of pixels (e.g., CMOS APS cells) that are fabricated on a semiconductor substrate. The semiconductor substrate is secured to a protective substrate by an adhesive such that the processed (frontside) surface of the semiconductor substrate faces the protective substrate. With the protective substrate providing structural support, the exposed backside surface of the semiconductor substrate is then subjected to grinding and/or chemical etching, followed by optional chemical/mechanical processing, to thin the semiconductor substrate to a range of 10 to 15 microns. A transparent substrate (e.g., glass) is then secured to the backside surface of the semiconductor substrate, thereby sandwiching the semiconductor substrate between the transparent substrate and the protective substrate.

6 Claims, 8 Drawing Sheets

BACKSIDE ILLUMINATED IMAGE SENSOR

This application is a division of Ser. No. 09/372,863 filed Aug. 12, 1999.

FIELD OF THE INVENTION

The present invention relates to solid state image sensors. More specifically, the present invention relates to a method for fabricating backside illuminated image sensors and to a backside illuminated image sensor fabricated by the method.

RELATED ART

Solid state image sensors are used in, for example, video cameras, and are presently realized in a number of forms including charge coupled devices (CCDs) and CMOS image sensors. These image sensors are based on a two dimensional array of pixels. Each pixel includes a sensing element that is capable of converting a portion of an optical image into an electronic signal. These electronic signals are then used to regenerate the optical image on, for example, a display.

CMOS image sensors first appeared in 1967. However, CCDs have prevailed since their invention in 1970. Both solid-state imaging sensors depend on the photovoltaic response that results when silicon is exposed to light. Photons in the visible and near-IR regions of the spectrum have sufficient energy to break covalent bonds in silicon. The number of electrons released is proportional to the light intensity. Even though both technologies use the same physical properties, all-analog CCDs dominate vision applications because of their superior dynamic range, low fixed-pattern noise (FPN), and high sensitivity to light.

More recently, however, CMOS image sensors have gained in popularity. Pure CMOS image sensors have benefited from advances in CMOS technology for microprocessors and ASICs and provide several advantages over CCD imagers. Shrinking lithography, coupled with advanced signal-processing algorithms, sets the stage for sensor array, array control, and image processing on one chip produced using these well-established CMOS techniques. Shrinking lithography should also decrease image-array cost due to smaller pixels. However, pixels cannot shrink too much, or they have an insufficient light-sensitive area. Nonetheless, shrinking lithography provides reduced metal-line widths that connect transistors and buses in the array. As discussed below, in frontside illuminated image sensors, this reduction of metal-line width exposes more silicon to light, thereby increasing light sensitivity. CMOS image sensors also provide greater power savings, because they require fewer power-supply voltages than do CCD imagers. In addition, due to modifications to CMOS pixels, newly developed CMOS image sensors provide high-resolution, low-noise images that compare with CCD imager quality.

CMOS pixel arrays are at the heart of the newly developed CMOS image sensors. CMOS pixel-array construction uses active or passive pixels. Active-pixel sensors (APSs) include amplification circuitry in each pixel. Passive pixels use photodiodes to collect the photocharge, whereas active pixels can include either photodiode or photogate light sensitive regions. The first image-sensor devices used in the 1960s were passive pixel arrays, but read noise for passive pixels has been found to be high, and it is difficult to increase the passive pixel array's size without exacerbating the noise. CMOS active-pixel sensors (APSs) overcome passive-pixel deficiencies by including active circuits (transistors) in each pixel.

FIG. 1 shows a CMOS APS image sensor circuit 100 that includes a pixel array 110 and control circuitry 120.

Pixel array 110 includes a closely-spaced matrix of APS cells (pixels) 140 that are arranged in rows and columns. Pixel array 110 is depicted as a ten-by-ten array for illustrative purposes only. Pixel arrays typically consist of a much larger number of pixels (e.g., 804-by-1016 arrays). Moreover, the pixels may be arranged in patterns other than rows and columns. Each APS cell 140 of pixel array 110 includes a light sensing element that is capable of converting a detected quantity of light into a corresponding electrical signal at an output terminal 150. The pixels in each row are connected to a common reset control line 123 and a common row select control line 127. The pixels in each column are connected through respective output terminals 150 to an associated common column data line 130.

Control circuitry 120 includes a row decoder 123 and sense amplifiers/registers 127. A timing controller (not shown) provides timing signals to row decoder 120 that sequentially activates each row of APS cells 140 via reset control lines 124 and row select control lines 125 to detect light intensity and to generate corresponding output voltage signals during each frame interval. A frame, as used herein, refers to a single complete cycle of activating and sensing the output from each APS cell 140 in the array a single time over a predetermined frame time period. The timing of the imaging system is controlled to achieve a desired frame rate, such as 30 frames per second in video applications. The detailed circuitry of the row decoder 123, sense amplifiers/registers 127 and timing controller is well known to one ordinarily skilled in the art. When detecting a particular frame, each row of pixels may be activated to detect light intensity over a substantial portion of the frame interval. In the time remaining after the row of APS cells 140 has detected the light intensity for the frame, each of the respective pixels simultaneously generates output voltage signals corresponding to the amount of light detected by that APS cell 140. If an image is focused on the array 110 by, for example, a conventional camera lens, then each APS cell 140 generates an output voltage signal corresponding to the light intensity for a portion of the image focused on that APS cell 140. The output voltage signals generated by the activated row are simultaneously provided to column output lines 130 via output terminals 150. Column output lines 130 transmit these output voltage signals to sense amplifiers/registers 127.

FIGS. 2(A) and 2(B) are simplified schematic and cross-sectional views showing a conventional frontside illuminated APS (image sensor) cell 140(1). APS cell 140(1) includes a photodiode 210, a reset transistor 220, an amplifier formed by a source-follower transistor 230, and a select transistor 240. Reset transistor 220 includes a gate connected to reset control line 124(1), a first terminal connected to a voltage source $V_{DD}$ (e.g., 5 volts) that is transmitted on a voltage source line 223, and a second terminal connected to a terminal of photodiode 210 and to the gate of source-follower transistor 230 via metal line 224. Reset transistor 220 controls integration time and, therefore, provides for electronic shutter control. Source-follower transistor 230 has a first terminal connected to voltage source line 223, a second terminal connected to a first terminal of select transistor 240. Source-follower transistor 230 buffers the charge transferred to column output lines 130 from photodiode 210, and provides current to charge and discharge capacitance on column output lines 130 more quickly. The faster charging and discharging allow the length of column output lines 130 to increase. This increased length, in turn, allows an increase in array size. Select transistor 240 has a gate connected to row select control line 125(1) and a second terminal connected to column data line 130(1) via output terminal 150(1). Select transistor 240 gives half the coordinate-readout capability to the array. Although reset transistor 220, source-follower transistor 230 and select transistor 240 would appear to increase the power consumption of APS cell 140(1) over passive pixel cells, little difference exists between an active and a passive pixel's power consumption.

FIG. 2(B) shows a simplified cross-section of conventional APS cell 140(1). APS cell 140(1) is formed in a P-type substrate 250 using known CMOS techniques. Photodiode 210 is formed in a first n-type diffusion (light sensitive) region 215. Voltage source $V_{DD}$ is applied via voltage source line 223 to a second n-type diffusion region 225 that is spaced from photodiode region 215. A first polysilicon gate structure 227 is provided over the space between diffusion region 225 and photodiode region 215 and connected to reset control line 124(1) to collectively form reset transistor 220. A third n-type diffusion region 235 is spaced from second region 225, and a second polysilicon gate structure 237 is formed over this space. Photodiode 210 is connected to second polysilicon gate 237 by metal line 224 to form source-follower transistor 230. A fourth n-type diffusion region 245 is spaced from third region 235, and a third polysilicon gate structure 247 is formed over this space and connected to row select control line 125(1) to form select transistor 240. Fourth diffusion region 245 is connected to output terminal 150(1), which in turn is connected to column data line 130(1). APS cell 140(1) is depicted as an n-channel device with electrons as the photo-generated charge carriers. In alternative embodiments (not shown), APS cells may be formed as a p-channel device with holes as the photo-generated charge carriers.

APS cell 140(1) operates in an integration and readout phase that is controlled by signals received on reset control line 124(1) and row select control line 125(1). Reset transistor 220 is pulsed on and off during the integration phase. This reset process causes the potential of photodiode region 215 to float at a reset level approximately equal to $V_{DD}$ less the threshold voltage of reset transistor 220. Photodiode 210 inherently includes capacitance to store an amount of charge proportional to the light intensity reflected from an object. The photogenerated current discharges the pixel capacitance and causes the potential of the photodiode 210 to decrease from its value of approximately $V_{DD}$ to another value, the signal value, which is dictated by the amount of photogenerated current. The difference between the reset and signal levels is proportional to the incident light and constitutes the video signal. Photodiode 210 is buffered from the output terminal 50 by source-follower transistor 230. Select transistor 240 is used to select the pixel for read-out. A problem associated with frontside illuminated CMOS APS cell 140(1) is that the active circuits, and in particular, the metal lines associated with the active circuits, reduce the fill factor (i.e., the ratio of light sensing area to total pixel area) of CMOS APS pixel arrays. In particular, as shown in FIG. 2(B), reset control lines 124, row select control lines 125, voltage source lines 223, metal lines 224 and column output lines 130 are all formed in an silicon-dioxide insulation layer located over P-substrate 250. Light, in the form of photons, passes through the insulation layer to light sensitive diffusion region 215, thereby producing a photovoltaic reaction. The presence of the metal and polysilicon lines associated with the active circuits reduces the amount of light that reaches the photodiode diffusion region 215, thereby producing a non-optimal fill factor. As mentioned above, the reduction of metal-line width associated with cutting edge CMOS fabrication processes exposes more silicon to light. However, even very thin metal lines produce some light blockage, thereby preventing frontside illuminated image sensors from achieving a 100% fill factor.

Backside illuminated image sensors are alternative image sensor structures that address the fill factor problems associated with front illumination. Backside illuminated image sensors receive light through a backside (lower) surface of the substrate supporting the CMOS image sensor circuitry. To detect light from the backside, the substrate must be extremely thin (i.e., in the range of 15 to 20 microns).

While backside illuminated image sensors eliminate the fill factor problems associated with frontside illuminated sensors, conventional methods for fabricating backside illuminated image sensors are expensive. Most notably, many conventional methods require non-standard fabrication process steps, such as a boron doping step and diffusion of special metal films that differ from standard CMOS processes and are performed to control the potential on the backside of the wafer during fabrication. In addition, packaging of conventional backside illuminated image sensors is performed after image sensor fabrication is completed (e.g., device fabrication on a semiconductor substrate, backside treatment of the semiconductor substrate, mounting the semiconductor substrate onto a permanent substrate, and thinning the semiconductor substrate to facilitate backside illumination). This post-production packaging of backside illuminated image sensors is logistically complex and produces high production costs.

What is needed is a method for fabricating back illuminated image sensors that minimizes the fabrication and production costs associated with conventional methods.

SUMMARY

The present invention is directed to a method for producing a back-illuminated CMOS image sensor in which the semiconductor wafer upon which pixels are fabricated is mounted onto a protective substrate, and then subjected to a material erosion process to thin the semiconductor substrate until the semiconductor substrate has a thickness that allows effective exposure of the pixels through the backside surface of the semiconductor substrate. Because the material erosion process takes place after the semiconductor substrate is mounted on the protective substrate, the CMOS image sensor can be fabricated using well-established processing parameters, thereby making the fabrication process less expensive to perform. In addition, because the method utilizes a protective substrate to support the semiconductor substrate, the thinning process is less expensive to perform. Further, the production method incorporates package formation using standard CMOS process steps, thereby reducing logistical complexity and production costs.

In accordance with one embodiment, the method begins by fabricating an image sensor circuit, including a matrix of pixels (e.g., CMOS APS cells), on the semiconductor substrate. The semiconductor substrate is then secured to the protective substrate using an adhesive such that the processed (frontside) surface of the semiconductor substrate (i.e., the surface upon which the image sensor circuit is formed) faces the protective substrate. The exposed backside surface of the semiconductor substrate is then subjected to the material erosion process (i.e., grinding and chemical etching, followed by an optional backside stripping technique such as chemical/mechanical polishing) to thin the semiconductor substrate until the semiconductor substrate is transparent to visible light, thereby effectively exposing the light-sensitive pixel diffusion regions of the image sensor circuit through the backside surface. In one embodiment, the semiconductor substrate is eroded until its thickness is in the range of 10 to 15 microns. The backside surface is then treated using known techniques (i.e., doping or backside metal film formation) to remove the backside depletion region and to drive electrons toward the frontside surface of the semiconductor substrate. A transparent substrate (e.g., glass) is then secured to the backside surface of the semiconductor substrate, thereby sandwiching the semiconductor substrate between the transparent substrate and the protective substrate. Openings are then formed in either the protective substrate or the transparent substrate, and metal leads are then formed to contact metal pads of the image sensor.

In accordance with another embodiment of the present invention, a back-illuminated CMOS image sensor includes a matrix of CMOS APS cells (light-sensitive pixel regions) that are produced on a semiconductor substrate. In contrast to prior art APS cells, the novel CMOS APS cell is formed on a frontside surface of the semiconductor substrate that is facing away from the image source. In particular, the novel CMOS APS cells include a photodiode diffusion region that extends into the substrate from the frontside surface, and several metal lines are formed in an insulator material that is formed on the frontside surface. A protective substrate is secured to the semiconductor substrate such that the metal lines are located behind the photodiode diffusion region (i.e., between the protective substrate and the semiconductor substrate). Finally, a transparent substrate (e.g., glass) is secured to the backside surface of the semiconductor substrate, thereby sandwiching the semiconductor substrate between the transparent substrate and the protective substrate.

The novel aspects of the present invention will be more fully understood in view of the following description and drawings.

DETAILED DESCRIPTION

The present invention is described below with reference to CMOS active-pixel sensors (APSs), and in particular to CMOS APSs utilizing photodiode light sensitive regions. However, the methods and structures described below may also be used to produce passive CMOS image sensors and CMOS APSs utilizing photogate light sensitive regions. In addition, the present inventors believe the methods and structures of the present invention may also be used to produce MOS pixel arrays and charge-coupled devices (CCDs).

Figure 3A:
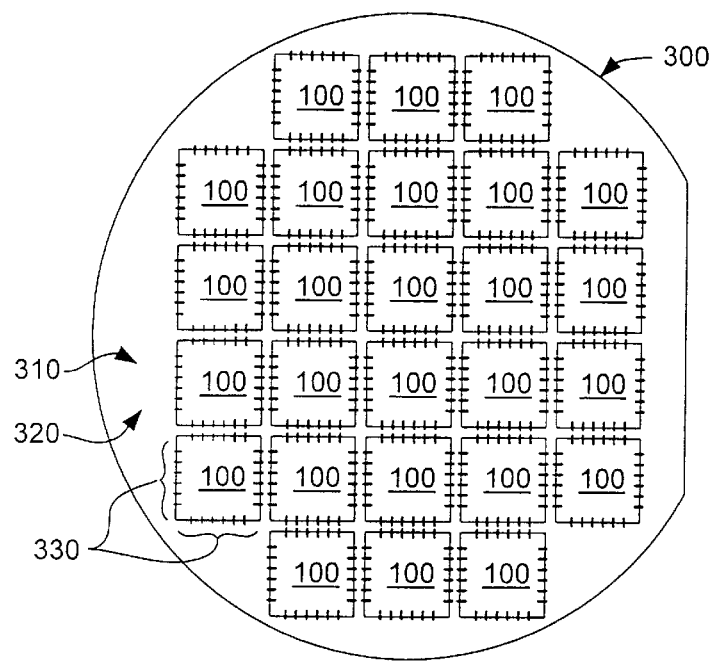
FIGS. 3(A) and 3(B) are simplified plan and partial cross-sectional views showing a semiconductor wafer that includes a plurality of image sensor circuits.
Figure 3B:
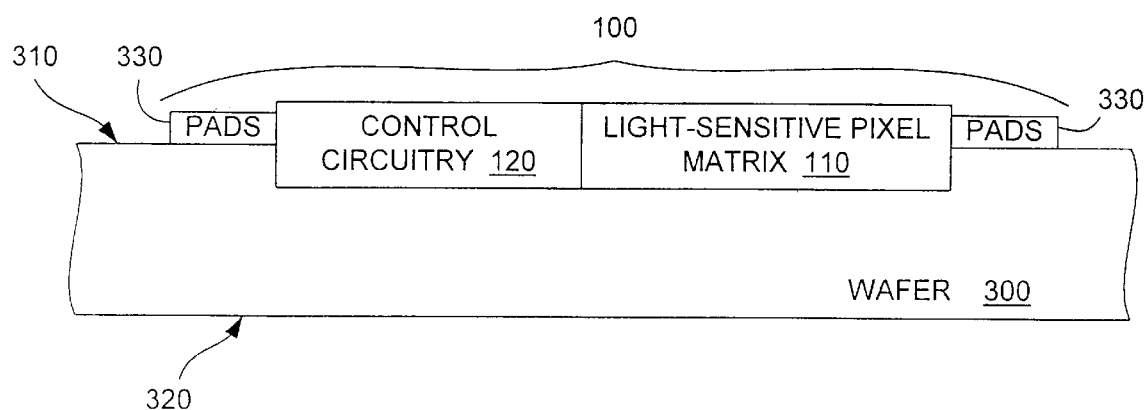

FIGS. 3(A) and 3(B) are plan and partial cross-sectional views showing a wafer 300 upon which is formed a plurality of image sensor circuits 100. Wafer 300 is, e.g., a silicon wafer having a thickness in the range of 600 to 650 $\mu$m, and includes a first (frontside) surface 310 and a second (backside) surface 320. Each image sensor circuit 100 is formed on first surface 310, and includes a matrix of light-sensitive pixel regions 110 (see FIG. 1) extending into wafer 300 from first surface 310. Each image sensor circuit 100 also includes control circuitry 120 (see FIG. 1) and a plurality of metal contact pads 330 extending onto first surface 310 of wafer 300. Insulation and metal lines (not shown) are formed on wafer 300 and provide connections between metal contact pads 330 and the matrix of light-sensitive pixel regions 110 and control circuitry 120. After the fabrication process is completed and wafer 300 is diced, each image sensor 100 is a fully packaged device with metal contact pads 330 providing contact points for external access to light-sensitive pixel regions 110 and control circuitry 120.

FIGS. 4(A) through 4(I) illustrate a method of producing backside illuminated image sensors 100 in accordance with a first embodiment of the present invention.

Figure 4A:
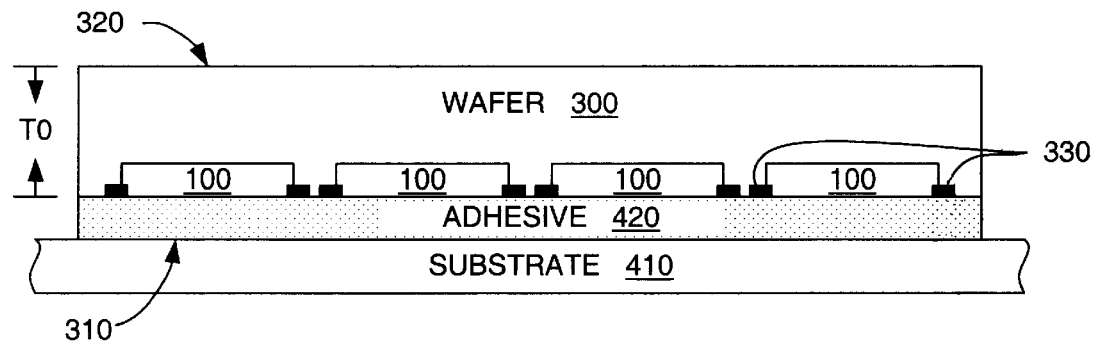
FIGS. 4(A) through 4(I) are cross-sectional views showing process steps associated with the production of backside illuminated image sensors in accordance with a first embodiment of the present invention.

FIG. 4(A) is a cross-sectional view showing a step of securing wafer 300 onto a protective substrate 410 with first surface 310 facing protective substrate 410. Specifically, as described above with reference to FIGS. 3(A) and 3(B), wafer 300 is pre-fabricated with image sensors 100 formed on first surface 310. Because fabrication of image sensors 100 is performed before mounting onto protective substrate 410, standard processes and equipment are used during the fabrication process. As mentioned above, wafer 300 has a beginning thickness T0 of 600 to 650 $\mu$m. A first adhesive layer 420 is deposited onto protective substrate 410, and then wafer 300 is placed onto protective substrate 410 such that first surface 310 contacts the deposited adhesive layer 410. In one embodiment, protective substrate 410 is formed from glass having a thickness of approximately 100 $\mu$m. Adhesive layer 420 is composed of, e.g., epoxy, and has a thickness in the range of 80 to 100 $\mu$m.

Figure 4B:
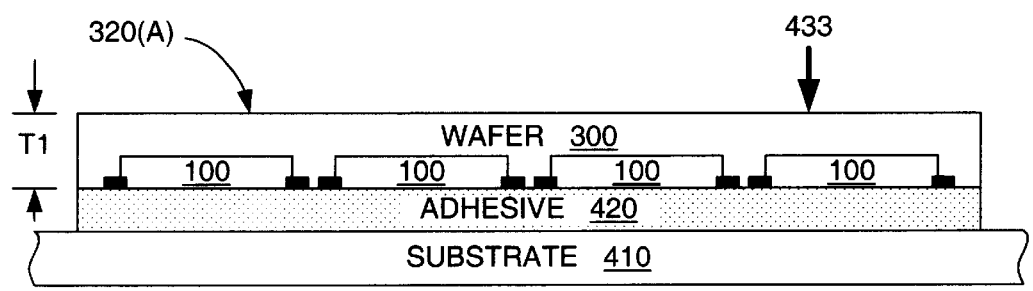
Figure 4C:
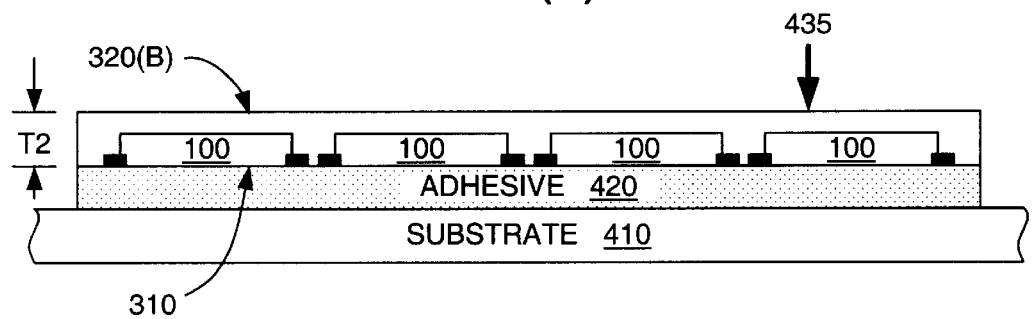

FIGS. 4(B) and 4(C) are cross-sectional views showing subsequent steps of removing material from second surface 320 of the wafer 300 until the light-sensitive pixel regions of image sensor circuits 100 are effectively exposed through the second surface 320. The term "effectively exposed" is used herein to indicate that the pixel of each light-sensitive pixel region generates electron flow in response to light (photons) passing through second surface 320. As such, the term "effectively exposed" is intended to cover the actual exposure of the diffused (n+) pixel regions on second surface 320, by may also cover the case where a thin, mostly transparent layer of p-type wafer material is located between each diffused pixel region and second surface 320.

Referring to FIG. 4(B), the process of removing material from second surface 320(A) of wafer 300 begins with a planar erosion process 433 whereby the thickness of wafer 300 is reduced to a thickness T1, which is in the range of 120 to 140 $\mu$m. In one embodiment, planar erosion process 433 includes coarse and fine grinding operations on second surface 320 using known techniques until wafer 300 is within the specified range. Subsequent to the grinding process, second surface 320(A) will have a certain amount of stress and defects that are removed in subsequent thinning steps (discussed below).

Turning now to FIG. 4(C), after planar erosion is completed, a chemical etchant 435 is applied to second surface 320(B) to further erode second surface 320(B) until wafer 300 has a thickness T2 in the range of 10 to 15 μm. Chemical etchant 435 is applied using equipment specially designed to perform chemical etching at high etch rates while maintaining a high level of uniformity. Such equipment is produced, for example, by SEZ AG of Villach, Austria. Chemical etchant 435 is, for example, HF (50%) and $HNO_3$ (70%) mixed with a ratio of 1:25 and applied at room temperature. Another suitable chemical etchant 435, which is also sold by SEZ AG, includes HF, $HNO_3$, $H_3PO_4$ and $H_2SO_4$. After the chemical etching process, it is important that all organic and grinding residues be removed from lower surface 320(B) using known methods. Further, if the roughness of lower surface 320(B) is a concern, an optional chemical/mechanical polishing process may be performed using known techniques to prepare lower surface 320(B) for further processing.

Figure 4D:
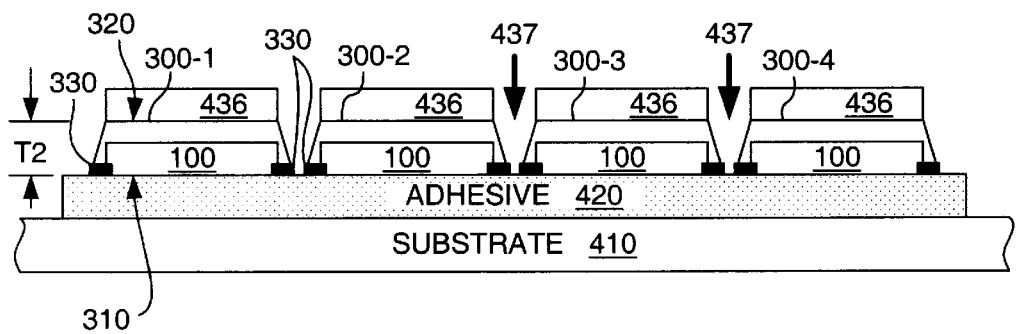

FIG. 4(D) illustrates a subsequent step of separating image sensor circuits 100 from each other using techniques disclosed in U.S. Pat. No. 5,455,455. In particular, second surface 320 is scribed along predetermined dice lines and then etched using an etchant 437 to separate the individual image sensor circuits 100. A resist coating 436 is patterned on wafer 300 over image sensor circuits 100 during this separation process, thereby maintaining the thickness T2 of wafer 300 in these regions. Etchant 437 is a conventional semiconductor substrate etching solution, which for silicon may be a combination of 24% potassium hydroxide (KOH), 63% water and 13% isopropanol, so as to etch the silicon down to metal contact pads 330 (i.e., to adhesive layer 420), as shown in FIG. 4(D). The result of wafer etching is a plurality of separated dies 300-1 through 300-4 arranged on substrate 410, each of which includes on image sensor circuit 100 and has a thickness (including image sensor circuit 100) in the range of 10 to 15 microns.

As mentioned in the background section (above), it is necessary to negatively charge backside surface 320 of each image sensor circuit 100 during operation as a backside illuminated image sensor device. In one optional process step, a metal film is formed over exposed backside surface 320 using known techniques that allows the application of the negative bias to control the depletion region during operation. According to another optional process, during fabrication of image sensor circuits 100, a special implant step is performed that is introduced before the source/drain implant activation. This special implant is, for example, As or Sb implanted at 150–400 KeV. While this second optional process adds a step to the fabrication process, it is relatively simple to implement.

FIGS. 4(E) through 4(I) illustrate process steps associated with the formation of a chip-size package (CSP) for dies 300-1 through 300-4 in accordance with the first embodiment. An alternative packaging process is disclosed below with reference to FIGS. 6(A) through 6(H).

Figure 4E:
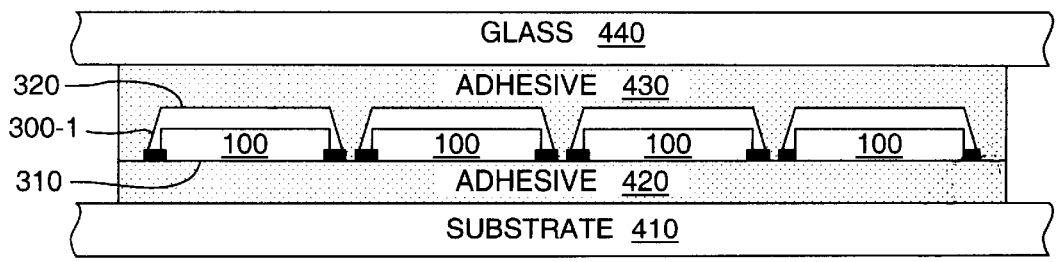

FIG. 4(E) is a cross-sectional view showing a process of securing a transparent (e.g., glass) substrate 440 onto the second surface 320 of the wafer 300, thereby producing a waferwise sandwich. In particular, transparent substrate 440 is bonded over dies 300-1 through 300-4 on the side thereof opposite to protective substrate 410. A layer 430 of epoxy is applied on dies 300-1 through 300-4, and then transparent substrate 440 is placed onto epoxy 430. Note that epoxy 430 also fills the interstices between dies 300-1 through 300-4, thereby protecting each of the image sensor circuits 100. Accordingly, each die 300-1 through 300-4 is completely surrounded by epoxy layers 420 and 430, and is sandwiched between protective substrate 410 and transparent substrate 440.

FIGS. 4(F) through 4(I) show process steps associated with the formation of metal leads that are connected to metal contact pads 330 of each image sensor circuit 100 to facilitate signal transmission between each image sensor circuit 100 and an external system (not shown). These metal leads are formed on protective substrate 410, thereby allowing the packaged image sensor circuits 100 to be mounted on, for example, a printed circuit board with transparent substrate 440 facing upward.

Note that the structures shown in FIGS. 4(F) through 4(I) are upside-down relative to FIGS. 4(A) through 4(E) (i.e., with transparent layer 440 below dies 300-1 through 300-4).

Figure 4F:
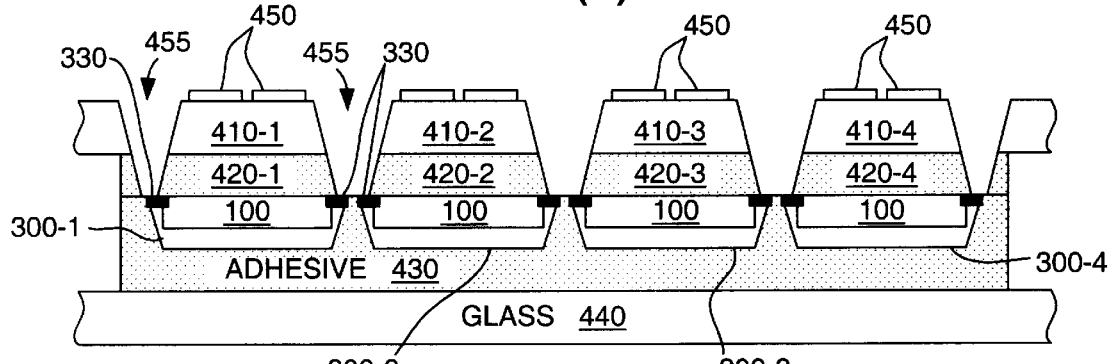

FIG. 4(F) is a cross-sectional view showing the formation of compliant layer portions 450, and the subsequent formation of grooves 455 through protective substrate 410 and adhesive layer 420 to expose metal contact pads 330 of that are located along the edges of dies 300-1 through 300-4. Grooves 455 separate protective substrate 410 into die-sized sections 410-1 through 410-4 that are respectively attached to dies 300-1 through 300-4 via adhesive regions 420-1 through 420-4. Note that dies 300-1 through 300-4 remain connected by transparent substrate 440 and epoxy 430.

Figure 4G:
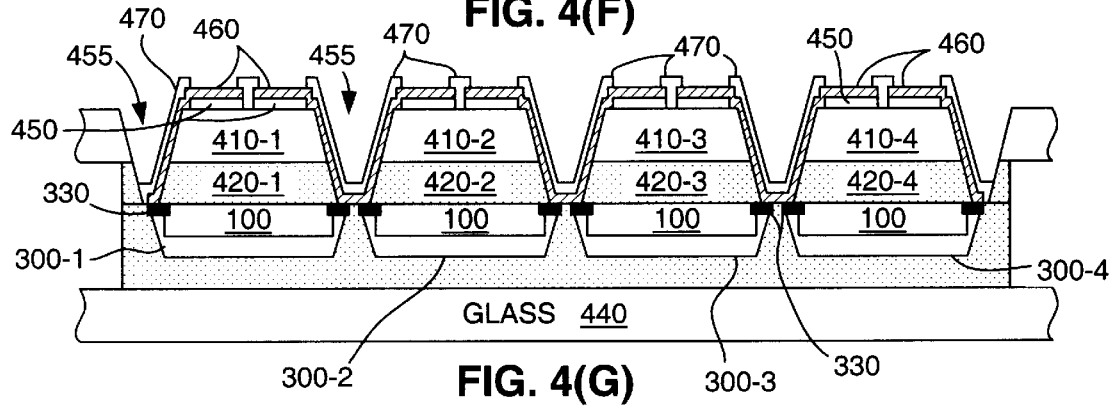

Referring to FIG. 4(G), after grooves 455 are formed, metal leads 460 are formed over die-sized sections 410-1 through 410-4. Each metal lead 460 extends from an associated compliant layer portion 450 to an associated metal contact pad 330. After the formation of metal leads 460, a solder mask (BCB) 470 is patterned such that a portion of each metal lead 460 located over its associated compliant layer portion 450 is exposed through an opening in solder mask 470.

Figure 4H:
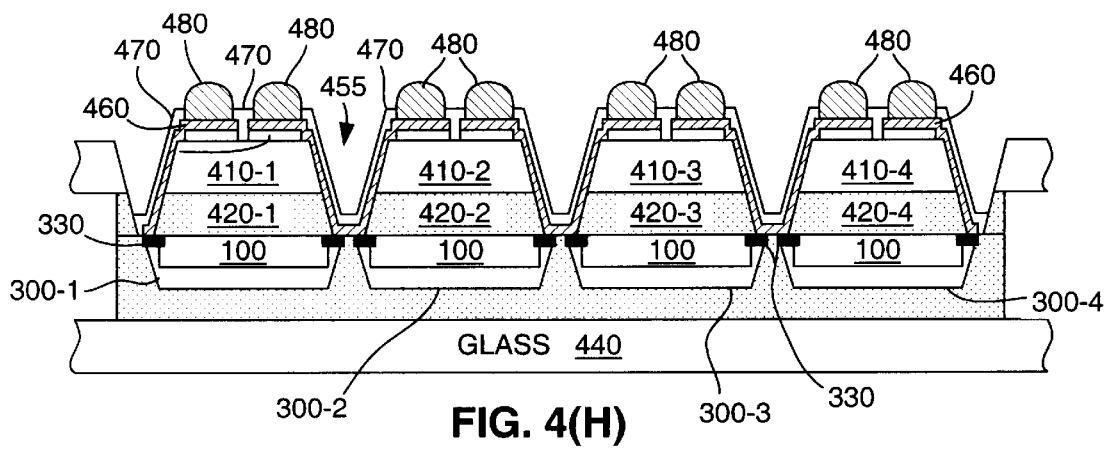

FIG. 4(H) shows the formation of solder bumps 480 using known ball-grid array (BGA) technology. Each solder bump 480 is formed on the exposed portion of an associated metal lead 460.

Figure 4I:
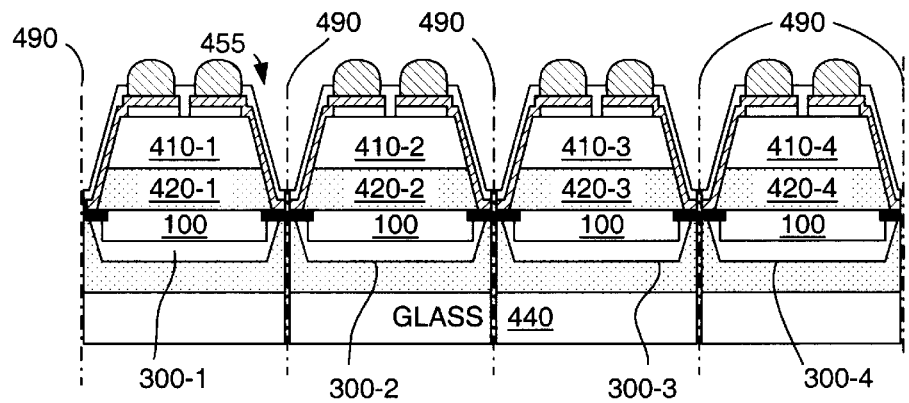

Finally, FIG. 4(I) is a cross-sectional view illustrating a dicing process during which the waferwise sandwich is sliced along lines 490 that extend into grooves 455, thereby separating die-sized sections 410-1 through 410-4 into separate backside-illuminated image sensor devices. The dicing process is performed using known mechanical sawing techniques.

A benefit provided by the fabrication process illustrated in FIGS. 4(A) through 4(I) is that each of the disclosed process steps is performed using standard wafer processing techniques and equipment. In particular, the disclosed thinning and separating steps can be incorporated into a fabrication process without the need for special bonding technologies, thinning techniques and packaging steps. Therefore, the disclosed fabrication process reduces the complexity, direct cost, cycle time, handling and shipping of back-illuminated CMOS APS devices, thereby providing such devices at a lower cost than conventional back-illuminated CMOS APS devices.

Figure 5:
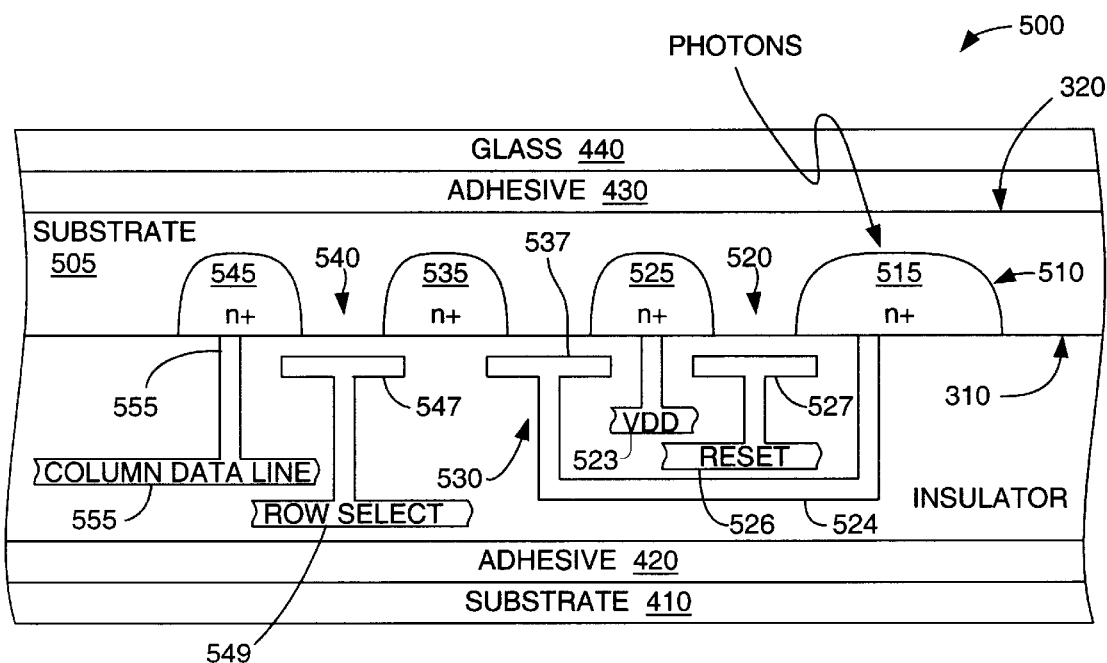
FIG. 5 is a cross-sectional view showing a backside illuminated CMOS APS cell that is fabricated in accordance with the present invention.

FIG. 5 is a simplified cross-section showing a portion of a back-illuminated CMOS image sensor that is produced, for example, in accordance with the method shown in FIGS. 4(A) through 4(I). In particular, the back-illuminated CMOS image sensor includes a matrix of CMOS APS cells (light-sensitive pixel regions), including CMOS APS cell 500, that are produced on semiconductor substrate 505. In contrast to prior art APS cell 40(1), APS cell 500 is formed with front surface 310 facing down, and backside surface 320 facing upward (i.e. toward the source of photons). CMOS APS cell 500 is formed on first surface 310 of the substrate 505, and includes a photodiode 510 formed by a diffusion region 515 extending into substrate 505 from first surface 310. Several metal lines (e.g., metal line 524 connected between diffusion region 515 and polysilicon gate structure 537) are formed in an insulator material (e.g., silicon dioxide) that is located adjacent first surface 310 of substrate 505. A protective substrate 410-1 is secured to semiconductor substrate 505 such that the metal lines are located behind diffusion region 515 (i.e., between protective substrate 410-1 and substrate 505). Finally, a transparent substrate 440 is secured to second surface 320 of substrate 505 such that substrate 505 is sandwiched between transparent substrate 440 and protective substrate 410-1.

In accordance with an aspect of the present invention, substrate 505 is processed by grinding, chemical etching and an optional chemical/mechanical polishing process to have a thickness defined such that light-sensitive pixel region 500 is effectively exposed through second surface 320. As discussed above, this effective exposure is achieved by reducing the thickness of substrate 505 to the range of 10 to 15 microns.

In accordance with another aspect of the present invention, backside illuminated image sensor 500 further comprises a first adhesive layer 420, such as epoxy, that is located between protective substrate 410 and substrate 505, and a second adhesive layer 430 (also epoxy) that is located between transparent substrate 440 and semiconductor substrate 505. By selecting an epoxy with, for example, good optical qualities and a 98% transparency, there is virtually no degradation in the optical performance of image sensor circuits 100.

Figure 2A:
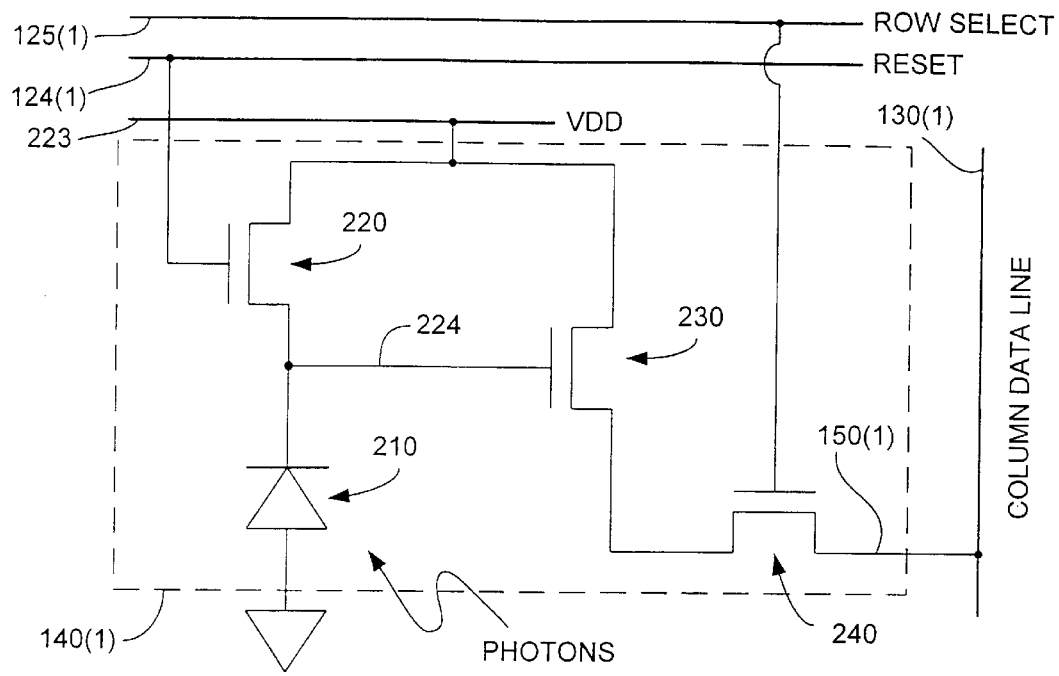
FIGS. 2(A) and 2(B) are simplified schematic and cross-sectional views showing a conventional front-illuminated CMOS APS cell.
Figure 2B:
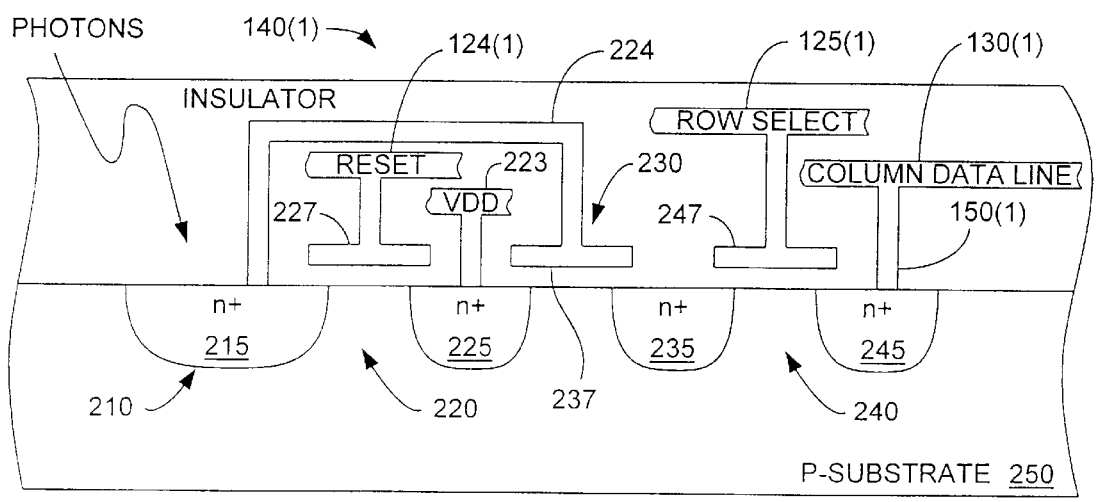

Referring again to FIG. 5, in accordance with another aspect of the present invention, each CMOS APS cell 500 is similar to conventional frontside illuminated CMOS APS cell 140(1) (see FIG. 2(B)), in that each CMOS APS cell 500 also includes active circuitry for controlling diffusion 515 of photodiode 510. Diffusion (light sensitive) region 515 is formed as an n-type in p-type substrate 505. Voltage source $V_{DD}$ is applied via voltage source line 523 to a second n-type diffusion region 525 that is spaced from photodiode region 515. A first polysilicon gate structure 527 is provided between diffusion region 525 and photodiode region 515 and connected to reset control line 526 to collectively form reset transistor 520. A third n-type diffusion region 535 is spaced from second region 525, and second polysilicon gate structure 537 is formed over this space. Photodiode 510 is connected to second polysilicon gate 537 by metal line 524 to form source-follower transistor 530. A fourth n-type diffusion region 545 is spaced from third region 535, and a third polysilicon gate structure 547 is formed over this space and connected to row select control line 549 to form select transistor 540. Fourth diffusion region 545 is connected to output terminal 550, which in turn is connected to column data line 555. APS cell 500 is depicted as an n-channel device with electrons as the photo-generated charge carriers. In alternative embodiments (not shown), APS cells may be formed as a p-channel device with holes as the photo-generated charge carriers.

Figure 1:
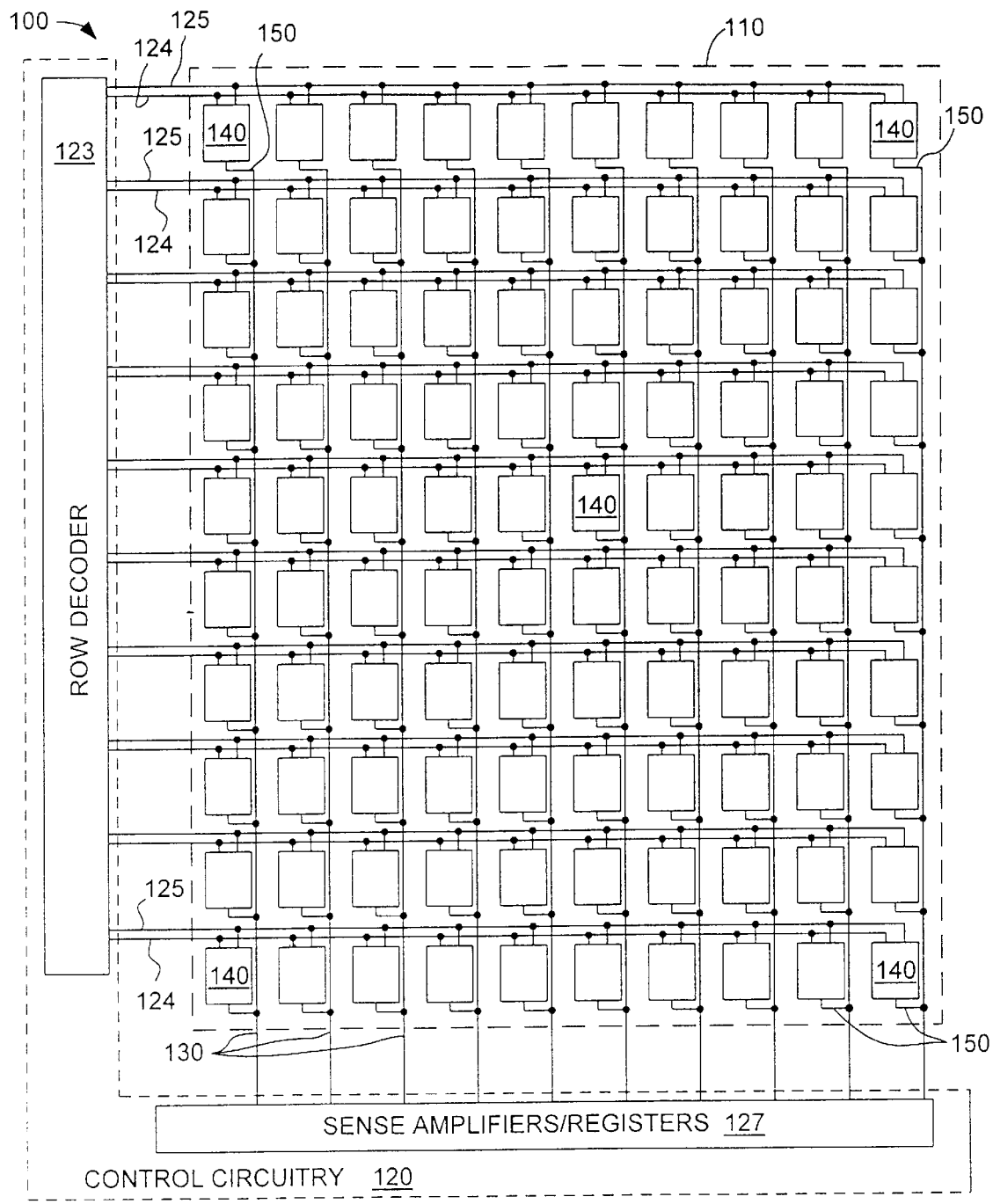
FIG. 1 is a schematic diagram of an active pixel sensor array.

Other than the backside arrangement, discussed above with reference to CMOS APS cell 500, the backside illuminated CMOS image sensor of FIG. 5 is arranged in a manner similar to that of conventional image sensor 100 shown in FIG. 1 and includes similar control circuitry (not shown in FIG. 5) and a matrix of CMOS APS cells 500. As such, CMOS APS cell 500 operates substantially in the manner described above with reference to FIG. 2(B), with the exception that the image sensed by APS cell 500 is located on the backside of substrate 505 (i.e., facing second surface 320).

FIGS. 6(A) through 6(I) illustrate a method of producing backside illuminated image sensors 100 in accordance with a second embodiment of the present invention.

Figure 6A:
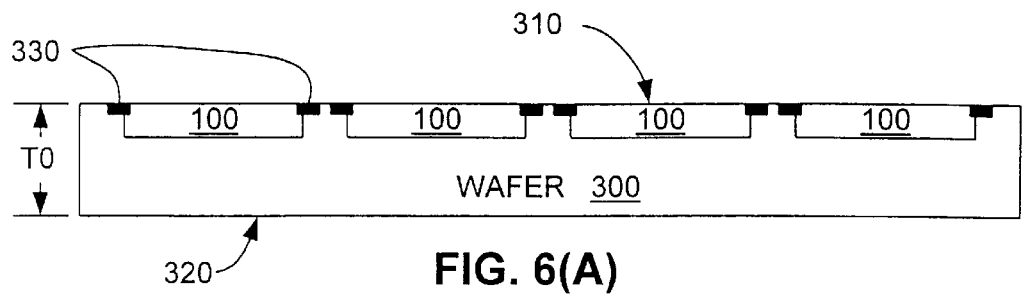
FIGS. 6(A) through 6(I) are cross-sectional views showing process steps associated with the production of backside illuminated image sensors in accordance with a second embodiment of the present invention.

FIG. 6(A) is a cross-sectional view showing wafer 300 that is pre-fabricated with image sensors 100 formed on first surface 310, and includes metal contact pads 330 exposed on first surface 310. As mentioned above, wafer 300 has a beginning thickness T0 of 600 to 650 µm.

Figure 6B:
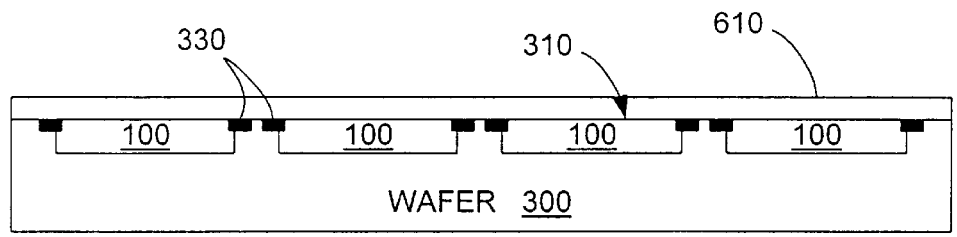

FIG. 6(B) shows the formation of a passivation layer 610 on upper surface 310 using known methods. In one embodiment, passivation layer 610 has a thickness in the range of 8500 and 9500 angstroms.

Figure 6C:
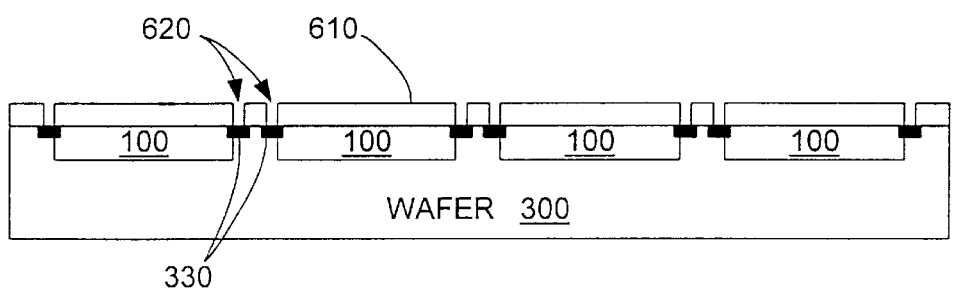

FIG. 6(C) illustrates the formation of holes 620 in passivation layer 610 through which metal contact pads 330 are exposed. Holes 620 are formed using known techniques.

Figure 6D:
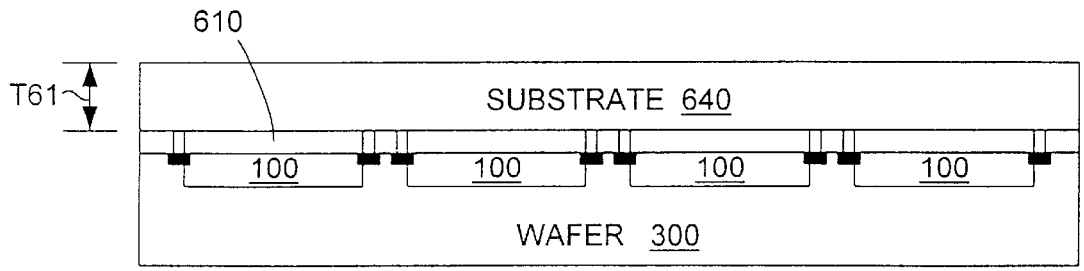

FIG. 6(D) shows the step of attaching a substrate 640 to wafer 300 such that passivation layer 610 is sandwiched therebetween. In one embodiment, substrate 640 is glass and has a thickness T61 in the range of 150 to 250 µm.

Figure 6E:
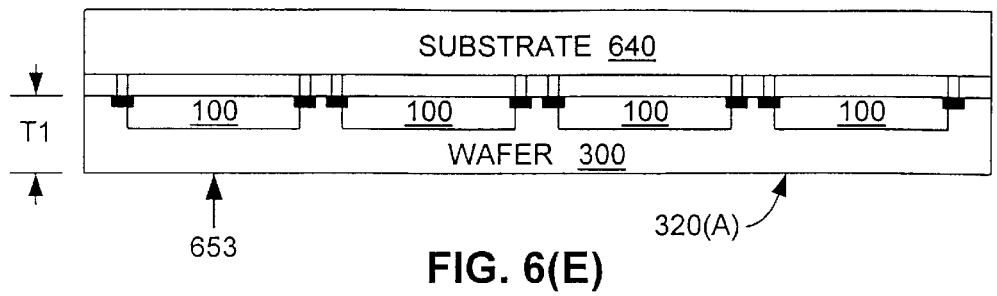

Referring to FIG. 6(E), the process of removing material from second surface 320(A) of wafer 300 begins with a planar erosion process 653 whereby the thickness of wafer 300 is reduced to thickness T1, which is in the range of 120 to 140 µm. In one embodiment, planar erosion process 633 includes coarse and fine grinding operations on second surface 320 using known grinding technologies until wafer 300 is within the specified range. In another embodiment, all planar erosion steps may be performed using chemical etching, although this embodiment may not be economical with current technologies.

Figure 6F:
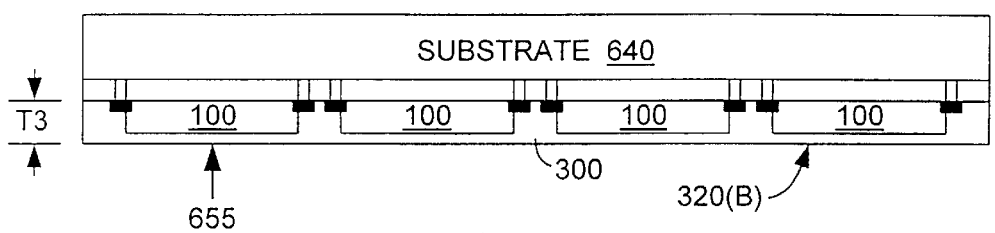

Turning now to FIG. 6(F), after planar erosion is completed, a chemical etchant 655 is then applied to second surface 320(B) to further erode second surface 320(B) until wafer 300 has the thickness T3 in the range of 10 to 15 µm. Suitable chemical etchants 635 are described above with reference to FIG. 4(C), as is equipment suitable for performing the chemical etching process. Unlike the embodiment shown in FIGS. 4(A) through 4(I), the present embodiment does not require the scribing and etching step (see description related to FIG. 4(D)).

Figure 6G:
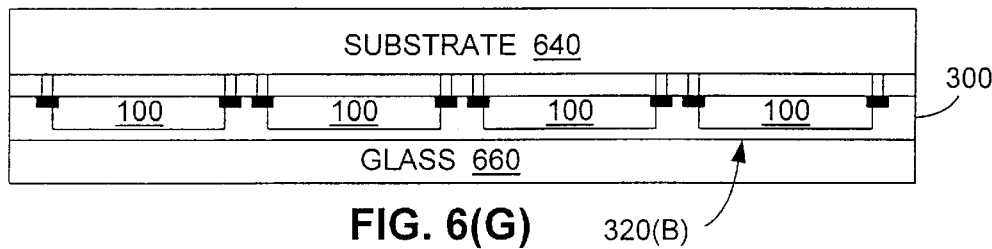

FIG. 6(G) illustrates a step of attaching a glass substrate 660 to second surface 320(B). Glass substrate 660 has a thickness of approximately 100 µm, and is attached using substantially transparent epoxy (not shown).

Figure 6H:
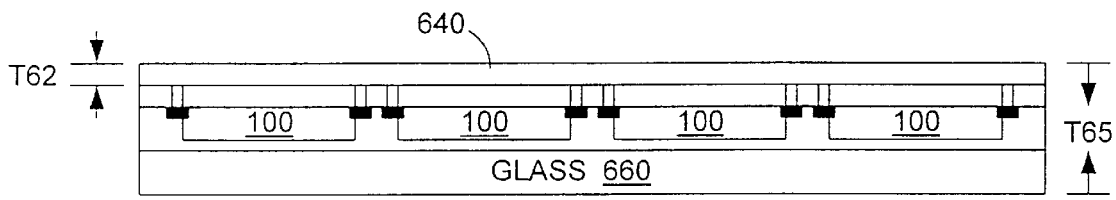

FIG. 6(H) illustrates a subsequent step of grinding substrate 640 to a thickness T62 of approximately 50 µm using known grinding technologies. This secondary grinding process provides an extremely thin overall device thickness in the range of 350 to 500 µm.

Figure 6I:
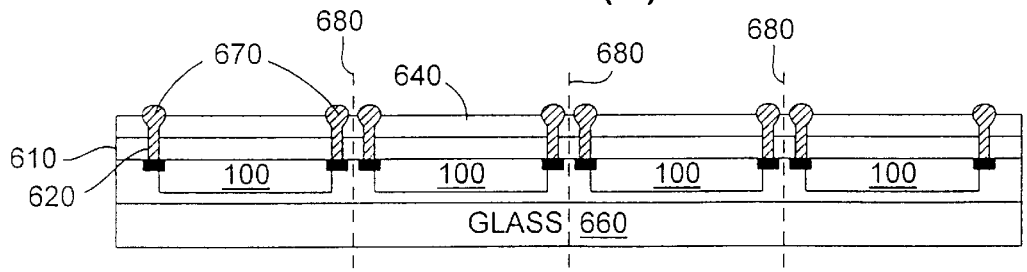

FIG. 6(I) shows the formation of openings through thinned substrate 640, and the formation of solder bumps 670 using known ball-grid array (BGA) technology. The openings formed in substrate 640 are aligned with openings 620 through passivation layer 610. Finally, FIG. 6(I) shows a dicing process during which the waferwise sandwich is sliced along lines 680, thereby separating the waferwise sandwich into die-sized sections, each section forming a separate backside-illuminated image sensor device.

As with the embodiment shown in FIGS. 4(A) through 4(I), the second embodiment described above provides a benefit in that the disclosed process steps are performed using standard wafer processing techniques and equipment.

Although the invention has been described in connection with several embodiments, it is understood that this invention is not limited to the embodiments disclosed, but is capable of various modifications which would be apparent to a person skilled in the art. For example, in addition to fabricating CMOS APS devices, the disclosed methods may be beneficially utilized to produce backside illuminated CCD image sensors, as well as passive pixel CMOS sensors and other MOS image sensors. Further, the particular parameters set forth in the above examples are exemplary, and may be altered to meet the requirements of particular fabrication processes. Thus, the invention is limited only by the following claims.

What is claimed is:

1. A backside illuminated image sensor comprising:
   a semiconductor substrate having a first surface and a second surface;
   a plurality of light-sensitive pixel regions formed on the first surface of the semiconductor substrate and including a photodiode diffusion region extending into the semiconductor substrate from the first surface;
   a metal line formed adjacent the first surface of the semiconductor substrate;
   a protective substrate secured to the semiconductor substrate such that the metal line is located between the protective substrate and the semiconductor substrate; and
   a transparent substrate secured to the second surface of the semiconductor substrate such that the semiconductor substrate is sandwiched between the transparent substrate and the protective substrate;
   wherein the semiconductor substrate has a thickness defined such that the light-sensitive pixel region is effectively exposed through the second surface.

2. The backside illuminated image sensor according to claim 1, further comprising a first adhesive layer located between the protective substrate and the semiconductor substrate, and a second adhesive layer located between the transparent substrate and the semiconductor substrate.

3. The back-illuminated image sensor according to claim 2, wherein each of the plurality of light-sensitive pixel regions further comprises:
   a second diffusion region that is formed in the semiconductor substrate and spaced from the photodiode diffusion region;
   a first polysilicon gate structure provided between the second diffusion region and the photodiode diffusion region;
   a third diffusion region that is formed in the semiconductor substrate and spaced from the second diffusion region;
   a second polysilicon gate structure that is provided between the second diffusion region and the third diffusion region;
   a fourth diffusion region that is formed in the semiconductor substrate and spaced from third diffusion region;
   a third polysilicon gate structure that is provided between the third diffusion region and the fourth diffusion region; wherein the photodiode region is connected to the second polysilicon gate by a first metal line to form a source-follower transistor, and wherein the first metal line is located between the semiconductor substrate and the protective substrate.

4. The backside illuminated image sensor according to claim 1, wherein the thickness of the semiconductor substrate is in the range of 10 to 15 microns.

5. The backside illuminated image sensor according to claim 1, wherein the transparent substrate is glass.

6. The backside illuminated image sensor according to claim 1, further comprising a plurality of metal leads formed on the protective layer.

* * * * *